United States Patent
Rahman

(10) Patent No.: US 9,602,983 B1
(45) Date of Patent: Mar. 21, 2017

(54) SENDING MESSAGES OR PERFORMING PREDEFINED ACTIONS OTHER THAN UNLOCKING ON A MOBILE DEVICE USING UNLOCKING MECHANISM

(71) Applicant: Amazon Technologies, Inc., Seatte, WA (US)

(72) Inventor: Omair Abdul Rahman, San Jose, CA (US)

(73) Assignee: AMAZON TECHNOLOGIES, INC., Seattle, WA (US)

( * ) Notice: Subject to any disclaimer, the term of this patent is extended or adjusted under 35 U.S.C. 154(b) by 32 days.

(21) Appl. No.: 14/613,161

(22) Filed: Feb. 3, 2015

(51) Int. Cl.
*H04M 3/00* (2006.01)
*H04W 4/12* (2009.01)
*H04W 52/02* (2009.01)
*H03M 7/40* (2006.01)

(52) U.S. Cl.
CPC .......... *H04W 4/12* (2013.01); *H03M 7/4025* (2013.01); *H04W 52/0274* (2013.01)

(58) Field of Classification Search
CPC . H03M 7/4025; H04W 4/12; H04W 52/0274; H04W 52/0254; H04W 52/028; G06F 21/31; G06F 21/36; G06F 2203/04101; G06F 2203/04104; G06F 2203/04803; G06F 2203/04808; G06F 3/041; G06F 3/0412; G06F 3/0416; G06F 3/04883; G06F 3/04886; G06F 3/0488; G06F 1/3218; G06F 1/3231; G06F 1/3262; G06F 1/3265; G06F 1/3287;
(Continued)

(56) References Cited

U.S. PATENT DOCUMENTS

| 2013/0191791 | A1* | 7/2013 | Rydenhag | ........... G06F 3/04883 715/863 |
| 2013/0346205 | A1* | 12/2013 | Hogg | ...................... H04L 51/20 705/14.58 |

(Continued)

OTHER PUBLICATIONS

MorseKey on the Apple Store on iTunes, What's New in Version 1.2.5, by HotPaw Productions, dated Nov. 15, 2013, retrieved on Feb. 19, 2015, from https://itunes.apple.com/us/app/morsekey/id312260358?mt=8, 2 pages.

(Continued)

*Primary Examiner* — Kathy Wang-Hurst
*Assistant Examiner* — B. M. M Hannan
(74) *Attorney, Agent, or Firm* — Davis Wright Tremaine LLP

(57) ABSTRACT

An electronic device having power management and a lock interface to unlock the electronic device uses that unlock interface to accept input sequences for alternate instruction sequences for predefined actions other than unlocking the electronic device. The lock interface can be a touchscreen interface. Alternate instructions could trigger powering up of selected subsystems of the electronic device as part of performing the alternate instructions. The alternate instruction sequences can comprise message send sequences and those message send sequences can include some characters of the message encoded using Morse code. The powered up subsystems might include a modem subsystem and an analog radio frequency ("RF") subsystem.

20 Claims, 8 Drawing Sheets

(58) Field of Classification Search
CPC .............. G09G 2330/022; H04M 1/67; H04M 1/72569; H04M 1/72577; H04M 2250/22
USPC ................................. 455/418, 566; 345/173
See application file for complete search history.

(56) References Cited

U.S. PATENT DOCUMENTS

| | | | | |
|---|---|---|---|---|
| 2014/0066017 | A1* | 3/2014 | Cho .................. | H04M 1/72519 455/411 |
| 2014/0095631 | A1* | 4/2014 | Ravi ...................... | H04L 51/12 709/206 |
| 2014/0106711 | A1* | 4/2014 | Seo ..................... | H04L 63/0861 455/411 |
| 2015/0126155 | A1* | 5/2015 | Lee ....................... | H04W 12/08 455/411 |
| 2015/0138101 | A1* | 5/2015 | Park ..................... | G06F 3/0412 345/173 |
| 2015/0195789 | A1* | 7/2015 | Yoon .................... | G06F 3/0488 345/173 |
| 2015/0199102 | A1* | 7/2015 | Koh ..................... | G06F 3/0488 715/835 |
| 2016/0014264 | A1* | 1/2016 | Yim .................. | H04M 1/72577 455/411 |
| 2016/0044157 | A1* | 2/2016 | Chen ................. | H04M 1/72577 455/418 |

OTHER PUBLICATIONS

McConnell, "Back to the Future—Morse Code and Cellular Phones," retrieved Feb. 19, 2015, from http://archive.oreilly.com/pub/post/back_to_the_future_morse_code.html, 5 pages.

* cited by examiner

SENDING MESSAGES OR PERFORMING PREDEFINED ACTIONS OTHER THAN UNLOCKING ON A MOBILE DEVICE USING UNLOCKING MECHANISM

BACKGROUND

Mobile devices are often designed with tight power consumption constraints since a common design goal is to maximize battery life while minimizing battery size. While this design goal also applies to many other scenarios, a familiar scenario for this design goal is the mobile device. In addition to using low-power processors, mobile devices save on power consumption by going into sleep, hibernate, power-off, etc. modes by user instruction or automatically after the passage of time with no user activity.

Since mobile devices are often misplaced, stolen or misused, it is common for a mobile device to have a lock/unlock feature whereby a user can actively instruct the mobile device to lock and/or the mobile device might be programmed to lock automatically after the passage of time with no user activity. In some cases, the locking is followed by a powering-down of parts of the mobile device. Of course, it is often the case that an unlocking mechanism is not powered down, so that even a power-saving mobile device can be unlocked quickly by its user.

As one example, a mobile device might be designed with multiple functional subsystems where each subsystem has some functionality that is able to be powered up and powered down independently of other subsystems. Such a mobile device might have a touch processing subsystem that remains powered up while a processor subsystem and a radio frequency ("RF") subsystem are powered down. That way, the touch processing subsystem is available to detect when the user attempts to unlock the mobile device via a touchscreen interface and, if successful, trigger the powering up of other subsystems, such as the processor subsystem, the RF subsystem, a modem subsystem, a display subsystem, etc.

BRIEF DESCRIPTION OF THE DRAWINGS

Various embodiments in accordance with the present disclosure will be described with reference to the drawings, in which.

DETAILED DESCRIPTION

Figure 1:
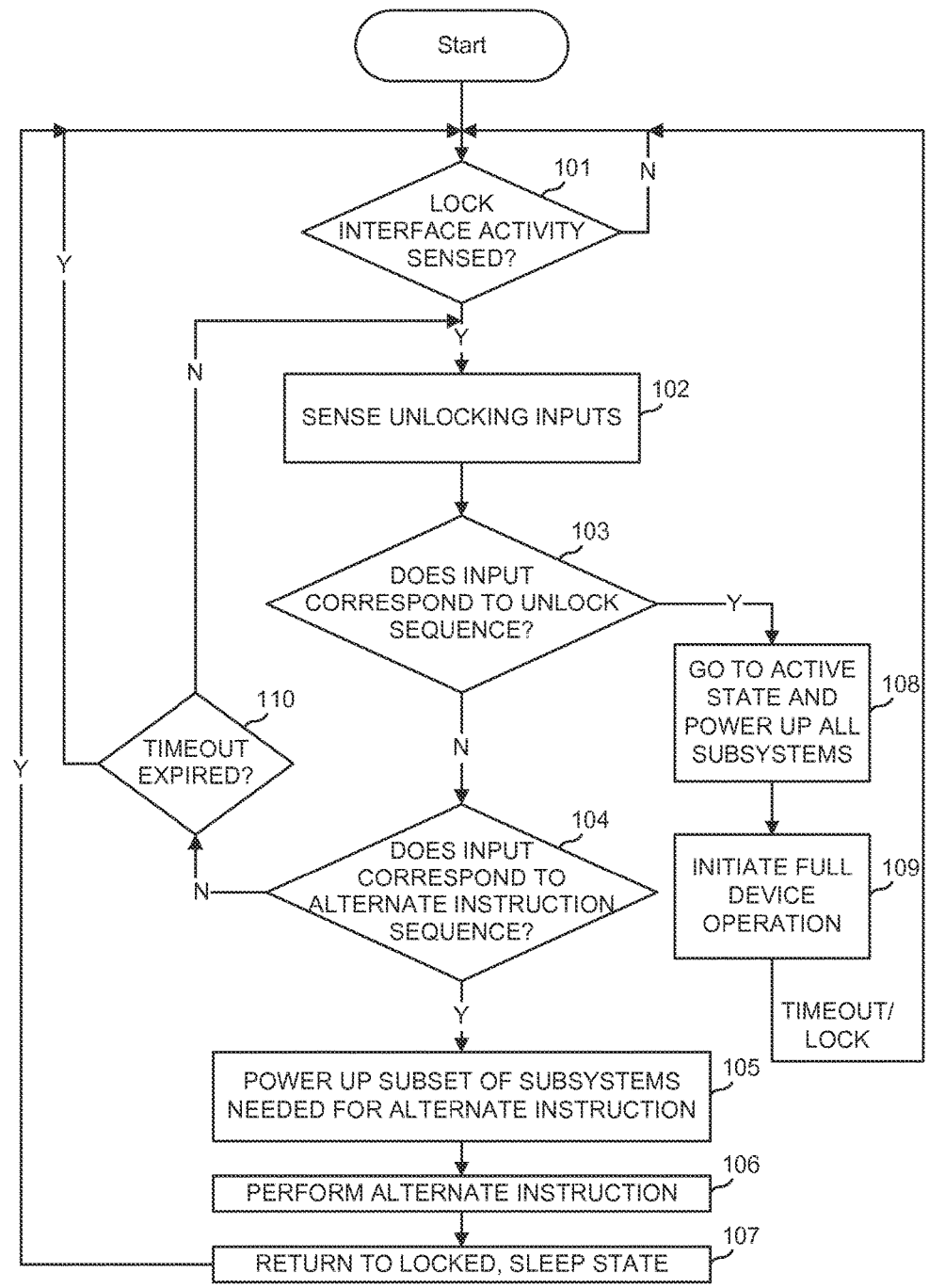
FIG. 1 is a flowchart illustrating a process for inputting unlock sequences and alternate instruction sequences using a lock/unlock interface of a device that has active states and sleep states.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Techniques described and suggested herein include sending messages using a mobile device's touchscreen while the mobile device is locked. In the more general case, the actions could include sending messages or performing predefined actions other than unlocking a mobile device and where a touchscreen is not used for unlocking the mobile device, the mobile device's unlocking interface could be used to send a message initiation signal in order to request the sending of a message or performance of other predefined actions. Message metadata (recipient ID, etc.) and message content might be input from the unlocking interface as a sequence of Morse code elements or as a predefined set of sequences.

Since the typical unlocking interface stays active and powered up while other portions or functions of the mobile device remain powered down, some actions that would normally require a full mobile device wake up can be performed in an ultra-low power mode without having to wake up all of the mobile device. The mobile device might be a battery-powered smartphone, tablet, reading device, or the like, where the duration of a battery charge is a constraint on user activities using that mobile device.

For example, suppose a mobile device that has active states and sleep states has subsystems that are in the sleep state while the mobile device is locked and has a touch sensor that is in the active state, so as to sense when the user is attempting to unlock the mobile device. With such a device, the touchscreen triggers a power management system to wake up other subsystems if the user inputs the correct unlocking sequence, such as a gesture sequence. A typical sequence of events, when a user desires to send a message using a locked mobile device, is to unlock the mobile device by interacting with the touchscreen that is in an active state to unlock the device. That triggers a wake up of other subsystems, such as a processor subsystem, a display subsystem, an analog radio frequency ("RF") subsystem, etc. The user then uses the mobile device in a normal manner to create and send the message. In a novel power-efficient mode, the mobile device is programmed so that messages can be created by a message generator and sent using the active touch processing subsystem without having to wake up all of the other subsystems normally used for sending messages. For example, a short message, such as a Short Message Service ("SMS") message, might be input using the touchscreen without waking up the display subsystem or a main processor subsystem. Instead, the power management system might just wake up a modem subsystem and an RF subsystem in order to get the short message out and/or selectively power other subsystems. The RF subsystem might be used for receiving incoming messages and transmitting outgoing messages. The message generator might be part of the touch processing subsystem.

In some cases, the touchscreen might store the inputs and the power management system might not wake up any other subsystems at that time. This might be useful for user commands that are input that do not need to be acted on immediately or do not need to be acted on until other subsystems are already awake. For example, the user might desire to set a number of reminders (e.g., "call Mom" or "find a tailor") that can be held in abeyance until the mobile device is fully powered up for other reasons. In other cases, whether the action is taken or queued might depend on other considerations, such as whether there is sufficient power to complete the task. In yet other variations, the determining factor is whether the electronic device is attached to an external power source that supplies charging power or other power to the electronic device.

The manner of inputting commands and information using the unlocking mechanism of a touchscreen should be adapted to limitations that might exist due to the state of subsystems such as their active/sleep states. For example, in mobile devices where users use a displayed on-screen keypad with visual feedback to enter characters, in the locked state where the display subsystem is asleep the user might be provided with a lower resolution, but more robust, mechanism for keying in information. This might be as basic as dividing the touchscreen into only two regions and interpreting user touches as ones or zeros, or dots and dashes, depending on which region is touched. From a sequence of touches, a message can be constructed, possibly using commonly known patterns such as Morse code.

Using the unlocking mechanism for tasks other than authentication and unlocking, other benefits might be seen in addition to power savings. This can help people with visual disabilities to send messages without having to deal with small keyboards on mobile devices. Of course, the power savings can be very beneficial in many cases, such as where a user needs to send a message but has very low battery levels.

In this description, unless otherwise indicated, subsystems are described as having a power state. In a first power state, referred to as "being powered up" or "active," the subsystem is provided sufficient battery or other power to perform its normal expected operations. For example, a processor can execute instructions when active, a display can present display contents to a user when active, a keyboard can accept user input when active, a wireless communications subsystem can communicate wirelessly when active, etc. In a second power state, referred to as "being powered down" or "asleep," the subsystem consumes less power than when in the first power state, but the subsystem is not as able to perform operations it could perform in the first power state. For readability, the first power state is referred to herein as the "active" state and the second power state is referred to herein as the "sleep" state. In addition, circuits, features, elements, or the like of a device, from something as simple as a single indicator light to something as complicated as a central processing unit, that can be moved between those two states as a unit, are referred to as a "subsystem" herein. Causing a transition from the first power state to the second power state is sometimes referred to as putting the subsystem to sleep, while a transition from the second power state to the first power state is sometimes referred to as waking up the subsystem. Setting the power state might be a function of the power management system. A processor core might be a subsystem that can be powered up and powered down as a unit. In such a case, a multi-core processor chip might comprise a plurality of subsystems.

It should also be understood that for some subsystems, there might be intermediate states, each with varying power consumption and capabilities. For readability, most of the examples herein will be with reference to subsystems that have just the two states (active, sleep). Extensions to subsystems with more than two states should be apparent upon reading this disclosure. For example, a display subsystem might have an active state wherein full functionality is available, a sleep state wherein no display of information is possible, and an intermediate state (such as a "lowered-power" state) where some display with lower illumination, resolution, etc. is possible.

FIG. 1 is a flowchart illustrating a process for inputting unlock sequences and alternate instruction sequences using a lock interface of a device that has active states and sleep states. This process might begin when a device is powered up or when it is put into a locked state. Typically, the locked state is exited, to an unlocked state, by entry of a password or secret known only to authorized users of the device. Examples of such secrets include four-digit numbers, strings of alphanumeric characters, and sometimes gesture sequences, such as a sequence of directional swipes of a touchscreen. This process might be performed by device components that make up a touch processing circuit.

In the locked state, many of the functions of the device and much of its data are not accessible to the owner of the device (or others who happen to have the device in possession or access to the device). For the functions that are not available, power need not be consumed in the locked state. For example, if the device prohibits displaying video when in the locked state, the device might power down a video processing chip in the device.

To obtain access to functions and data available only to authorized users, a user might perform an input sequence that triggers a change from the locked state to an unlocked state. If the input sequence is correct, then the device can power up those components that were powered down when in the locked state. Of course, not all components need be powered up and powered down aligned with the locked/unlocked state. For example, a transmitter might be powered down for use on an airplane and that transmitter might be set to remain off even if the user of the device successfully unlocks the device.

As shown in FIG. 1, the process begins at step 101 with a check to determine if lock interface activity has been sensed, e.g., that instances of input on the lock interface have occurred. In a specific example described in more detail below, the lock interface is a touchscreen interface and activity is sensed by the touchscreen in the presence of the user's finger or other means of changing a local physical environment in a way that can be detected by a sensor of the touchscreen. For example, a stylus, a conductive glove, a magnet, or other means might serve as a proxy for a finger to trigger touch or proximity sensing of the sensor of the touchscreen.

For readability, FIG. 1 will be described with reference to the specific example of the lock interface being a touchscreen and circuit or processor that performs pattern recognition on touches of the touchscreen. However, in other variations, an interface other than a touchscreen interface is used by the electronic device to control unlocking the electronic device. For example, buttons might be provided for entry. In any case, unlocking the electronic device might involve inputting an unlock input pattern and, if the correct unlock input pattern is provided, the electronic device is unlocked, otherwise it remains in the locked state.

If lock activity is not sensed, the device remains at that step of the process, looking or waiting for lock interface activity. If activity is sensed, the lock interface begins sensing unlocking inputs, at step 102. These might be touch positions, gestures, patterns or other inputs. The unlocking inputs can be stored in memory such as volatile memory that retains its contents only when power is supplied. The lock interface, at step 103, checks whether the input corresponds to an unlock sequence, such as a valid password or secret gesture sequence. If the input does not correspond to an unlock sequence, the lock interface moves to step 104, and checks whether the input corresponds to an alternate instruction sequence.

If the input corresponds to an alternate construction sequence, the lock interface at step 105 powers up a subset of subsystems of the electronic device that are needed to perform the alternate instruction. For example, if the alternate instruction is to send a message over a cellular connection, a cellular transceiver subsystem might be powered up. To save power, not all possible subsystems need be powered up for some alternate instructions. For example, if an illuminated keyboard is provided, a user keyboard input subsystem might be left powered down in the locked state to save power.

In the more general case, there is a first set of subsystems that is powered up when the device is unlocked and a second set of subsystems (possibly with some subsystems in common with the first set of subsystems) that is powered up when the device is locked but a valid alternate instruction is to be performed. Where the second set of subsystems uses less power than the first set of subsystems, power is conserved. The second set of subsystems might be a subset of the first set of subsystems. Once that subset of subsystems is powered up and running, the device can perform the alternate instruction, at step 106, and then return to a locked, sleep state (step 107). The lock interface would then return to looking or waiting for lock interface activity (step 101).

Note that the alternate instructions can be executed without ever unlocking the device. For security reasons, the device might be programmed to only allow a predefined set of operations to be specified with the alternate instructions. For example, the alternate instructions might be limited to sending predefined messages to predefined recipients and storing notes to the user of the device.

In step 103, if the lock interface does detect an unlock sequence, it might proceed to step 108 and go into an active state, powering all of the subsystems normally powered up when the device is unlocked. From there, the device can initiate full operation of the device's functions and access to data, at step 109. Typically, after a period of inactivity, the device will automatically return to the locked state and look or wait for lock interface activity, at step 101. The device might also return to the locked state in response to a user request to lock the device, such as by pressing a "sleep" button.

In step 104, where the input does not correspond to an alternate instruction sequence, the lock interface can proceed to step 110 to check if a timeout period has expired. If not expired, the lock interface returns to step 102 to sense more inputs. If the timeout period has expired, the lock interface returns to step 101 to look or wait for lock interface activity. By having a timeout period, the unlocking inputs stored in memory can be erased after a time and the unlocking process can begin anew.

Figure 2:
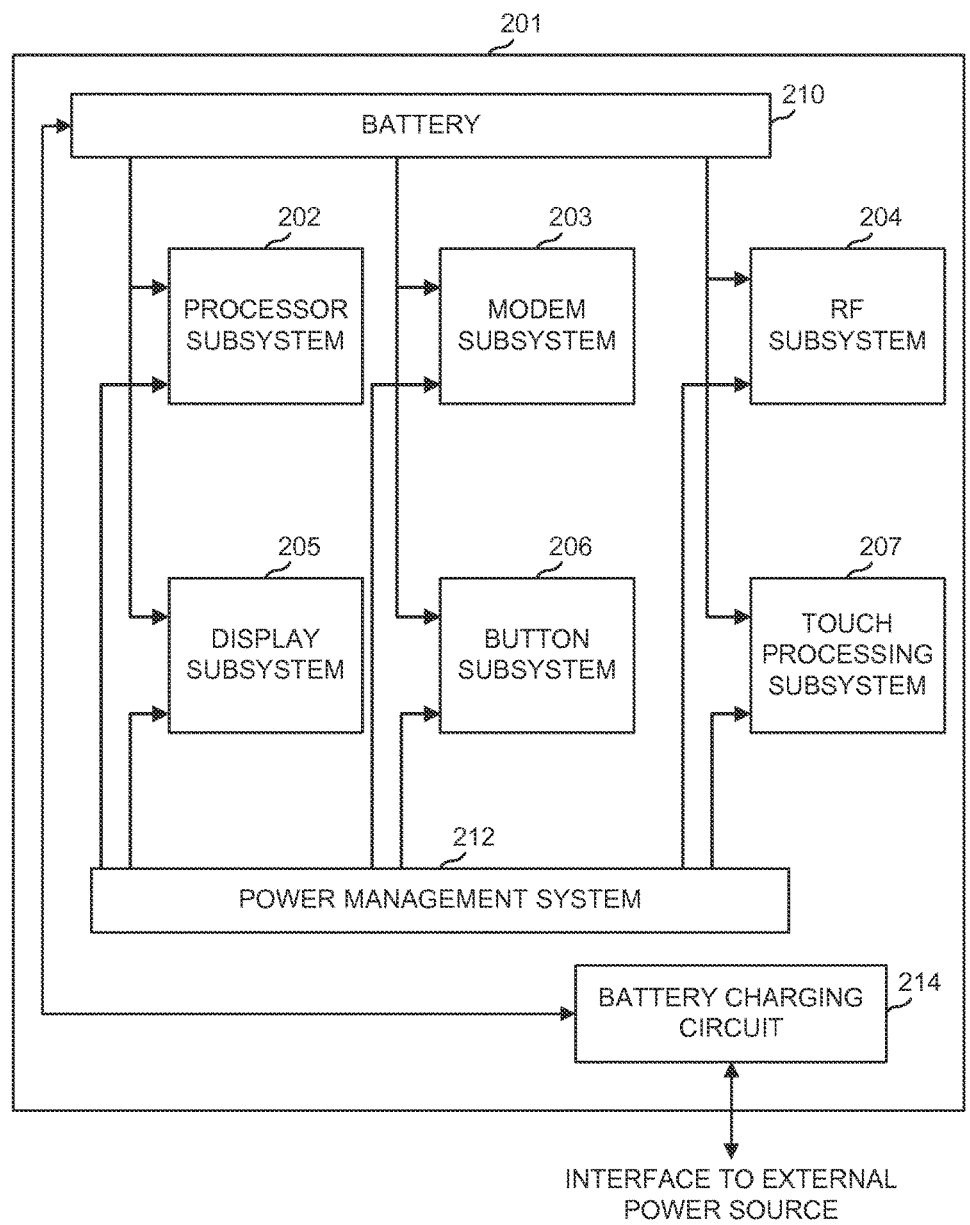
FIG. 2 is a block diagram of subsystems of an electronic device for which power usage can be managed.

FIG. 2 is a block diagram of subsystems of an electronic device for which power usage can be managed, by a power management system and/or a lock interface. As shown there, an electronic device 201 has a processor subsystem 202, a modem subsystem 203, an RF subsystem 204, a display subsystem 205, a button subsystem 206, a touch processing subsystem 207, a battery 210, and a power management system 212. Battery 210 provides battery power to each of subsystems 202 to 207 and power management system 212 provides an input to each of those subsystems to signal a power state for that subsystem. Battery 210 might be charged by a battery charging circuit 214 that can be coupled to an external power source.

Examples of electronic device 201 might include a smartphone, tablet, reading device, or the like and might include other subsystems not shown in FIG. 2. Some of the subsystems might comprise single integrated circuits. For example, electronic device 201 might have a processor chip that performs most of the computation needed to operate the electronic device, such as taking in user inputs, generating displays, running programs, communicating via data or voice, etc. In a locked state, the processor chip would usually not be tasked with handing various tasks that are not performed when electronic device 201 is not being used. Because of that, a preferred processor chip is one that can use much less battery power when the processor chip is not really in use, by going into a sleep mode. It may be the case that the processor chip has an input pin for a sleep mode signal, which might be provided by power management system 212, and in the sleep mode, the processor's clock is slowed, power is removed from all or part of the processor chip, and/or other techniques, which might include conventional sleep mode techniques.

In an example of states, electronic device 201 might have a locked state and an unlocked state, where in the locked state, power management system 212 signals to modem subsystem 203, RF subsystem 204, display subsystem 205, and button subsystem 206 that those subsystems should transition from their active state to their sleep state if they are not already in their sleep state. When transitioning from the locked state to the unlocked state, the power management system 212 signals to modem subsystem 203, RF subsystem 204, display subsystem 205, and button subsystem 206 that those subsystems should transition to their active state. Where the lock interface of the electronic device 201 uses a touchscreen, that touchscreen and touch processing subsystem 207 might remain in their active states. In some electronic devices, the touch processing subsystem 207 is a separate low-power chip or chipset. As explained herein, the power state for a subsystem could be a zero-power state, a low-power state, a full-power state, or some intermediate power state. In some embodiments, power management system 212 is integrated with touch processing subsystem 207.

Modem subsystem 203 and RF subsystem 204 might be arranged as a wireless communication subsystem that is powered up and powered down as a unit, where it is not useful to have only one of modem subsystem 203 and RF subsystem 204 powered up without the other. Various other arrangements of an electronic device into subsystems that can be powered up and powered down independently of the other might be used instead of the specific examples illustrated.

Figure 3:
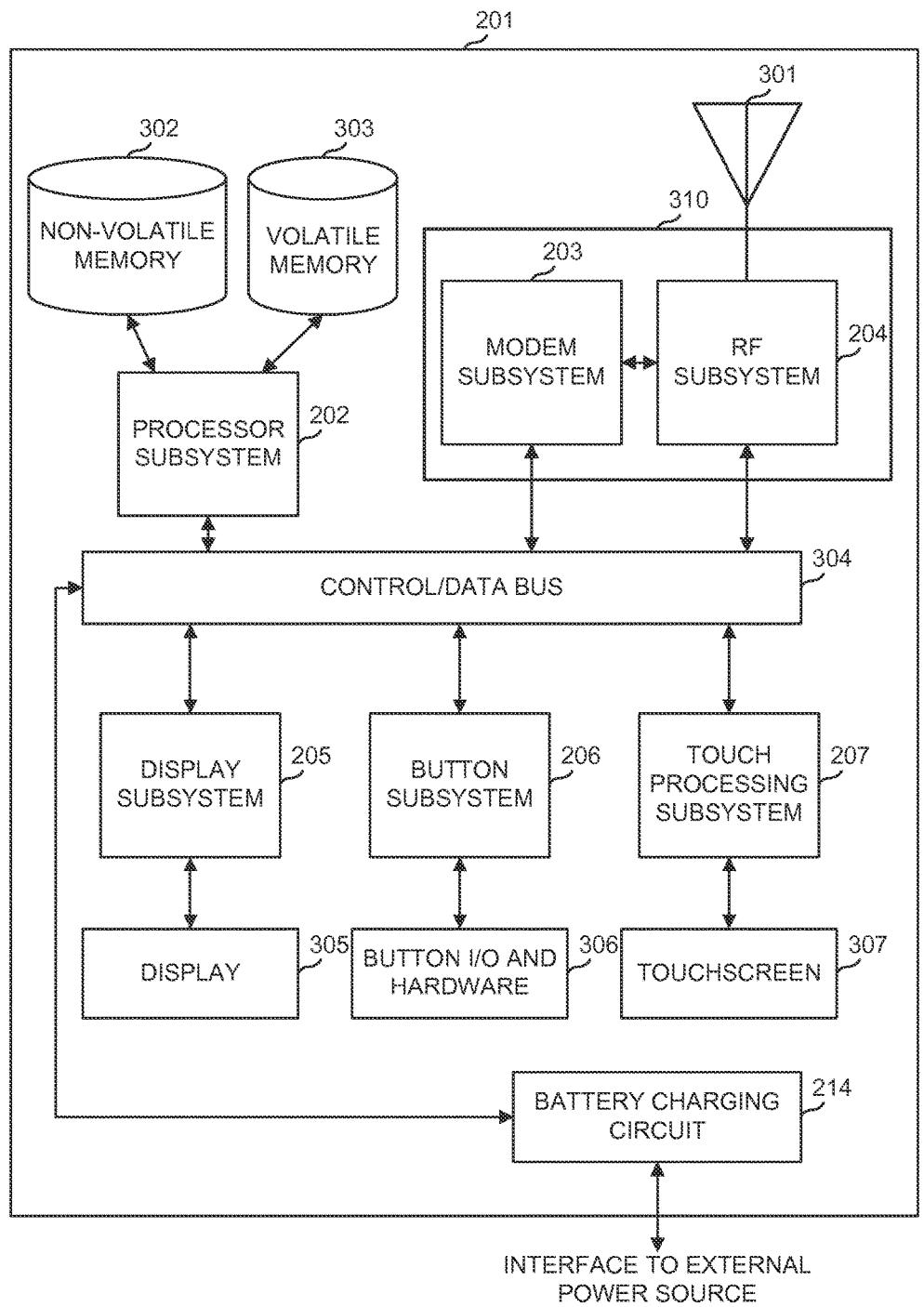
FIG. 3 is a block diagram of components of an electronic device.

FIG. 3 shows the subsystems and other components of electronic device 201, including additional components such as antenna 301, non-volatile memory 302, volatile memory 303, control/data bus 304, display 305, button input/output ("I/O") and hardware 306, and touchscreen 307. As illustrated, each of subsystems 202 through 207 are coupled to control/data bus 304, and non-volatile memory 302 and volatile memory 303 are accessible by processor subsystem 202. Display 305 is shown coupled to display subsystem 205. Button I/O and hardware 306 is shown coupled to button subsystem 206, and touchscreen 307 is shown coupled to touch processing subsystem 207. Each of the elements shown in FIG. 3 might be part of a conventional device such as a smart phone, mobile tablet computer, or reading device that allows for selective control of power usage by various components thereof. Other elements not shown in FIG. 3 might also be present, such as a wired network interface. Antenna 301 might be external to a device case or internal to a device case. Touch processing subsystem 207 is shown comprising a message generator 312. Message generator 312 might be implemented as program code executed by touch processing subsystem 207 and might not require any additional hardware.

Figure 4:
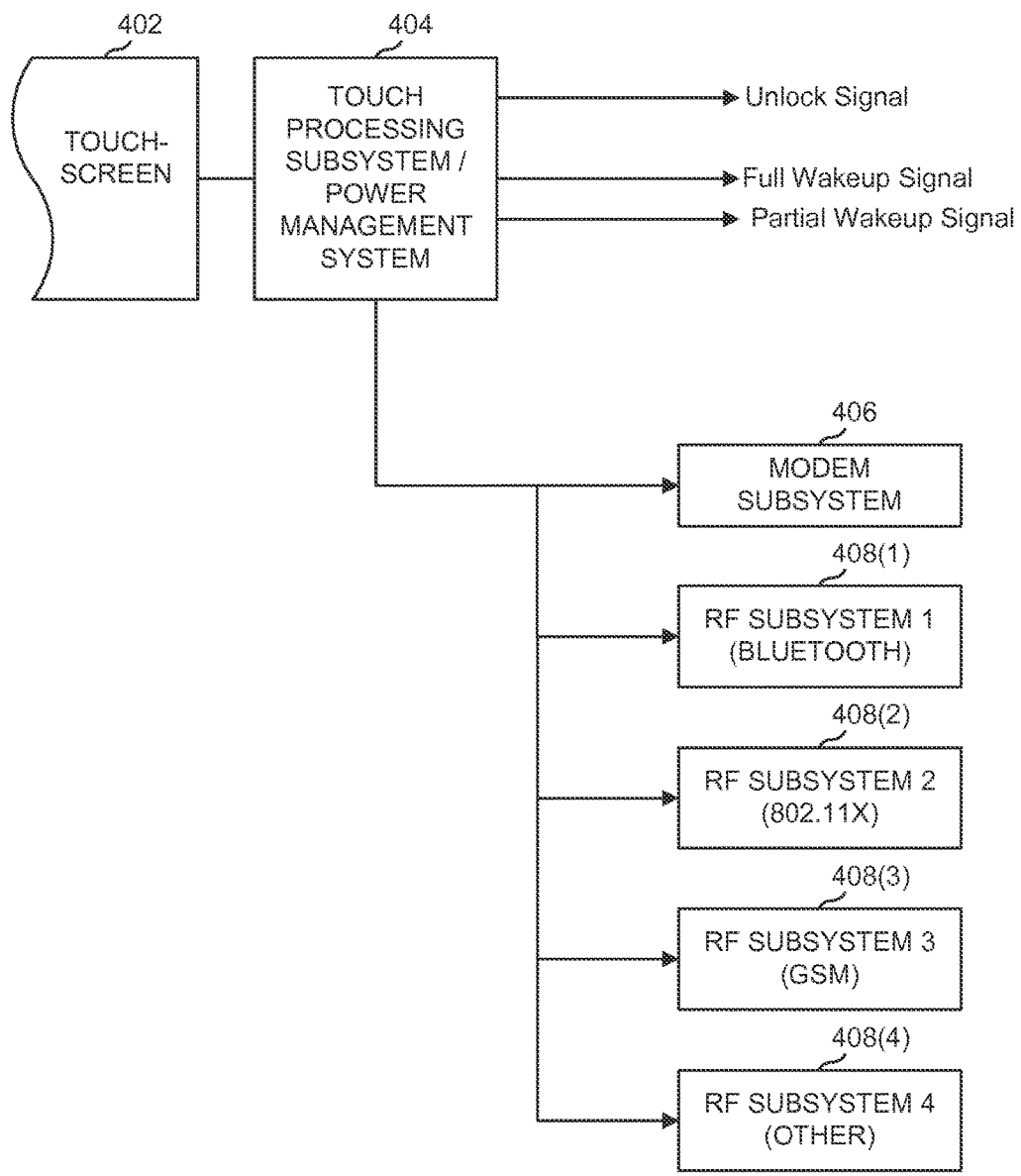
FIG. 4 is a more detailed block diagram of communications portions of an electronic device.

FIG. 4 is a more detailed block diagram of communications portions of an electronic device that provides for novel signaling described herein. As shown, a touchscreen 402 is coupled to a touch processing subsystem and/or power management system 404, which is in turn coupled to a modem subsystem 406 and several RF subsystems 408(1)-408(4). In these examples, the touch processing subsystem and/or power management system are distinct items, usually in two different integrated circuits ("ICs"). In a specific implementation, the power management system is part of an applications processor and its power management IC ("PMIC"), while the touch processing subsystem is part of a touch controller chip. The description of the various subsystems in the figures could refer to different groupings of subsystems on different controllers and ICs. It is possible that a single IC might have more than one subsystem. For example, the PMIC might have more than one subsystem and thus have some circuits that can be powered up fully while other circuits on that PMIC are in a sleep mode.

Touch processing subsystem and/or power management system 404 might perform the process illustrated in FIG. 1 and result in sending power management signals to various subsystems as well as outputting various signals to provide state information to other components, e.g., an unlock signal, a full wakeup signal, and a partial wakeup signal. Depending on what alternate instruction sequence the touch processing subsystem and/or power management system 404 might detect, it can signal any needed subsystems to power up.

Figure 5:
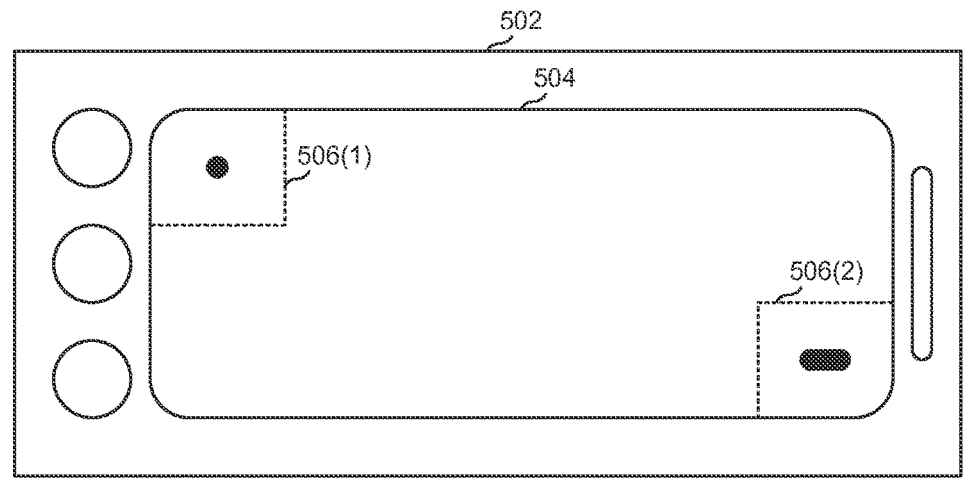
FIG. 5 is a schematic diagram of a mobile device having a touchscreen interface for sensing binary inputs such as dots and dashes of Morse code.

FIG. 5 is a schematic diagram of a mobile device 502 having a touchscreen interface for sensing binary inputs such Morse code elements such as Morse code dot elements and Morse code dash elements. A touchscreen 504 of mobile device 502 is able to sense touches even in a locked state, as that is how a user might typically unlock mobile device 502 into an unlocked state. Touchscreen 504 can sense touches in different areas of the available screen space. When unlocked and fully powered up, mobile device 502 might display information and images on a display that underlies the touch sensor of touchscreen 504. Such information and images would be useful for guiding the user as to which areas of touchscreen 504 to touch. For example, the display might present an image of a button labeled "Press here to continue." However, in the locked state, it might be preferable to have the display totally unpowered. Even with the display totally unpowered, the touch sensor can detect where the user is touching. With sufficient separation and minimal numbers of touch regions, a user can enter a sequence of touches without needing any visual feedback.

In the example of FIG. 5, there are two touch regions 506(1) and 506(2) delineated with dashed lines. The dashed lines are not displayed to the user, but with touch region 506(1) being in the upper left corner of touchscreen 504 and touch region 506(2) being in the lower right corner of touchscreen 504, there is enough separation that a user can unambiguously provide a touch input pattern that can be converted to the desired touch sequence without any visual feedback. In one type of conversion, a plurality of touch inputs on a touch sensor are converted into a digital sequence based on a location of each touch input on the touch sensor. The digital sequence might represent different regions of the touch sensor being touched.

The touch sequence might be interpreted as Morse code, with a touch in touch region 506(1) being interpreted as a Morse code dot and a touch of touch region 506(2) being interpreted as a Morse code dash. These regions might be referred to as the dot region and the dash region, respectively. In this manner, a user could input a message or command without unlocking mobile device 502 and without any visual feedback. In some variations, some low power visual feedback, such as the flashing of a light emitting diode ("LED"), might be provided. It might also be possible to use message send sequences that include some characters of the message encoded using Morse code with some other portion of the message encoded with control sequences other than Morse code characters.

Morse code is flexible enough to cover all the letters of the alphabet and some punctuation, but where mobile device 502 is to be used by someone who has not memorized the Morse code dot/dash sequences and does not have an easily available reference, other interpretations of the touch sequence could be used. For example, instead of touch regions 506(1)/(2) being interpreted as dot/dash, respectively, they might be interpreted as 0/1, respectively. It might be that the user has configured mobile device 502 to interpret the touch sequence 0-1-0-1-0-1-1 to mean "Send a message to my assistant to check today's schedule" and the touch sequence 0-1-0-1-1-1-1 to mean "Cancel all of today's appointments" and the user has memorized those touch sequences and their associated actions.

While not required, touch sequences might have a specific preamble, such as 0-1-0-1, so that mobile device 502 has an easier time distinguishing intentional touches from random unintentional touches. In some cases, the specific preamble might be known only to authorized users so that the use of mobile device 502 in the locked state to send messages and perform other actions can be at least partially secured against unauthorized use of that feature.

Figure 6:
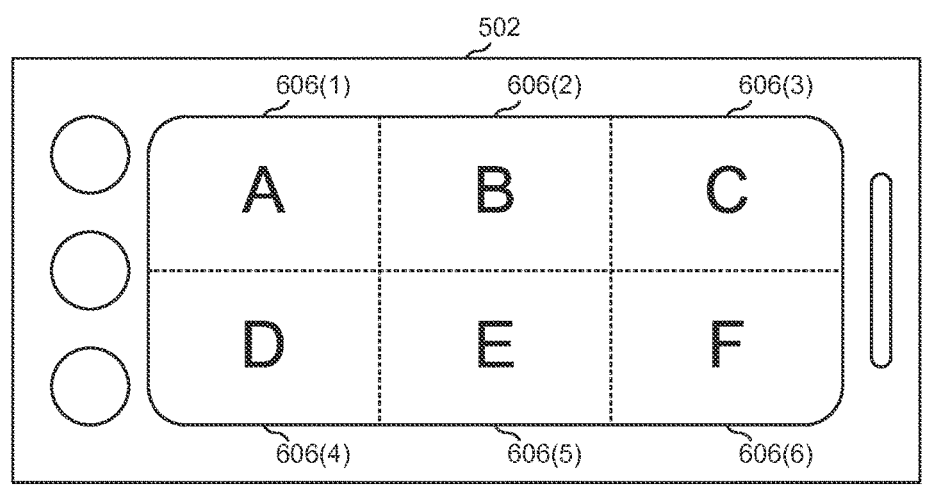
FIG. 6 is a schematic diagram of a mobile device having a touchscreen interface for sensing inputs from the touchscreen interface.

FIG. 6 shows a variation of what is shown in FIG. 5, where here the touchscreen is divided into six tiled regions 606(1) through 606(6). Those tiled regions 606 might be represented by the letters A, B, C, D, E, and F, thus allowing the user to enter a touch sequence that is a sequence of those six letters. Since the regions are tiled, i.e., they occupy all of the available area, some touches might be ambiguous and subject to guesswork by the user. The dashed lines are not presented to the user, so the user has to judge where each tile begins and ends. The touch regions might instead be arranged so that they are not tiled and there is some inactive region around each of the active touch regions. The touch region arrangement might be set by the user according to user preference. Those preferences, the particular prestored touch sequences, and their corresponding actions might be stored in non-volatile memory available to the touch processing subsystem of the mobile device.

Figure 7:
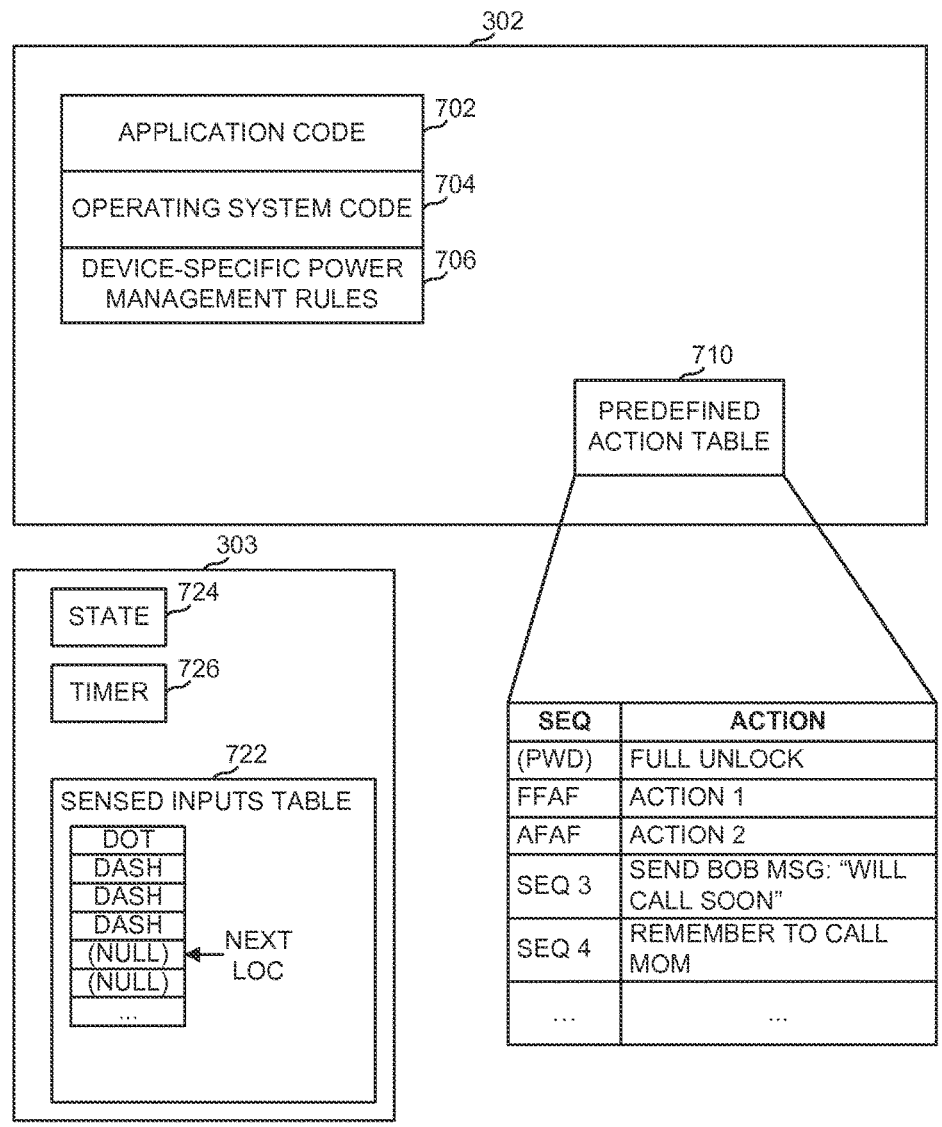
FIG. 7 is a schematic diagram of memory and memory structures as might be used in the electronic device shown in FIG. 3.

FIG. 7 is a schematic diagram of memory and memory structures as might be used to store touch sequences and their corresponding actions, as well as other data and information. The memory structures shown might be those shown in FIG. 3, namely non-volatile memory 302 and volatile memory 303. Non-volatile memory 302 is shown including storage for application code 702, operating system code 704, device-specific power management rules 706, and a predefined action table 710. Predefined action table 710 is shown in detail, in the form of a lookup table of touch sequences and corresponding actions. For example, predefined action table 710 shows that if the user inputs the touch sequence corresponding to the device's password, the action taken by the touch processing subsystem will be to signal the device to perform a full unlock of the device, whereas if the user inputs the touch sequence F-F-A-F, the action taken by the touch processing subsystem will be to perform the action(s) defined by Action 1. Each action might be represented as a string or other data structure specifying the particular action to take.

Volatile memory 303 might include memory storage for queued messages that are queued when input and sent when additional power is supplied to the electronic device and memory storage for predefined actions defined by one or more steps to be performed by the electronic device and having an associated alternate instruction sequence. FIG. 7 shows some contents of volatile memory 303, such as a sensed inputs table 722, a state variable storage 724, and a timer value storage 726. The additional power might be supplied by an alternate power source, such as a power cord.

Sensed inputs table 722 contains the currently sensed touch sequences and the touch processing subsystem might allow this table to fill up until there is a match with a touch sequence listed in predefined action table 710. This might be done using the process illustrated in FIG. 1 or similar. State variable storage 724 maintains a value of the lock state of the mobile device. The lock state of the mobile device might be one of a locked state, in which the mobile device is locked against unauthorized and/or unintentional use, and an unlocked state, in which the mobile device can be used normally. Timer value storage 726 maintains a timer as might be used to limit the amount of time allowed for entering a touch sequence, which might be useful to prevent sensed input table 722 from filling up with unintentional touches.

In the illustration of FIG. 7, sensed input table 722 is populated with the values "DOT" and "DASH" and predefined action table 710 is populated with touch sequences that are sequences of A through F. It may be that A represents DOT and F represents DASH, as they are in similar locations on the touch surface, or it may be that the user is permitted to use more than one interpretation of touch sequences.

Figure 8:
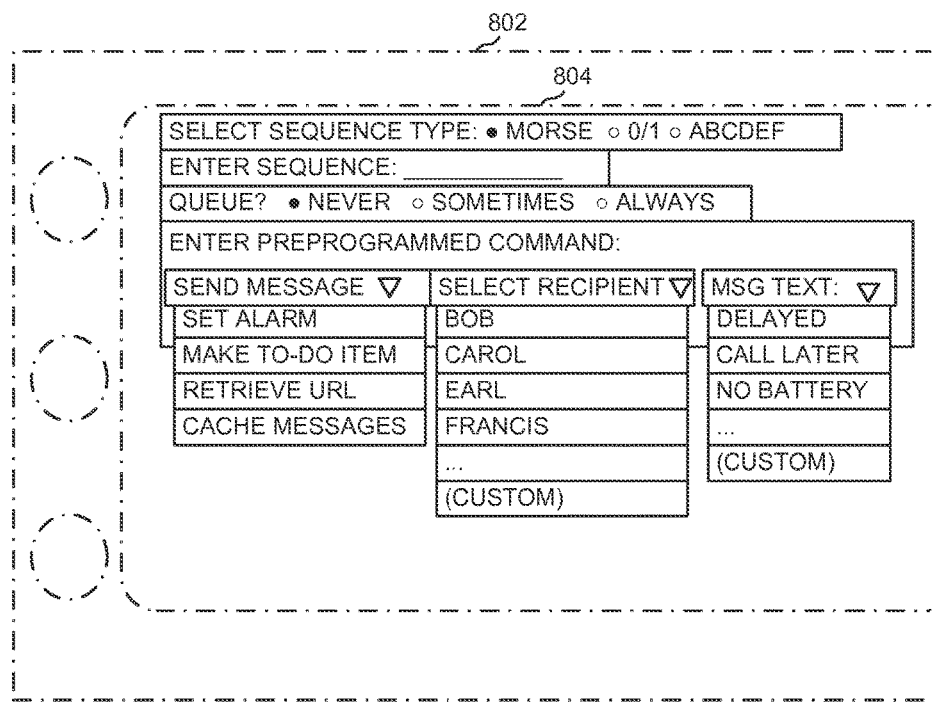
FIG. 8 is an illustration of an example user interface that can be used to input alternate instruction sequences.

FIG. 8 is an illustration of an example user interface that can be used to input alternate instruction sequences, illustrating how different interpretations might coexist. This user interface is typically provided using the display portion of a touchscreen 804 while a mobile device 802 is in an unlocked state. Using this interface, a user can select settings for alternate instructions.

As illustrated, the user can specify that a touch sequence is to be interpreted using Morse code, binary, or selections from the set {A, B, C, D, E, F} and then provide the sequence. In this example, the user is able to set a queue setting indicating if the alternate instruction is to be always performed as soon as the touch sequence is entered (never queued), if the alternate instruction is to be always queued until other alternate instructions are received or some other condition is met, or if the alternate instruction is to be queued only when certain conditions are met. For example, as a power-saving technique, some touch sequences representing alternate instructions might not need to be performed right away and might be accumulated until portions of the electronic device are powered up for other reasons.

As an example, suppose that there is an alternate instruction to set a reminder and transmit that reminder to a remote calendar server. To send this reminder, a modem subsystem and a wireless communication subsystem might be powered up without powering up the entire mobile device. However, if timeliness is not essential, the touch processing subsystem might store the reminder instruction in a queue and when the modem subsystem and a wireless communication subsystem are powered up for other instructions, such as time sensitive instructions, the queued reminder can be sent then. It may be that whether to send immediately or to queue would depend on some other considerations, such as a battery charge level. In such cases, for example, an alternate instruction that is given a queuing status of "Sometimes" might be acted upon immediately if there is more than 20% battery charge available but queued if the battery charge is less than 20% of battery charge capacity. Examples of wireless communication subsystems include cellular network interface hardware, 802.11 hardware, BLUETOOTH™ communication subsystems, and the like.

In some variations, there is a stored value for a minimum battery charge level and that stored minimum battery charge level is compared with a current battery charge and if the current battery charge is greater than the stored minimum battery charge level, the touch processing subsystem might cause more subsystems to wake up than if the current battery charge is less than or equal to the stored minimum battery charge level. In some variations, the determination is based on whether the electronic device is currently receiving power from an external source, such as via a battery charging port or other battery charging interface. For example, the electronic device might be programmed to determine a battery charge level and compare the battery charge level to the minimum battery charge level, then if the battery charge level is higher than the minimum battery charge level, set a power state of one or more subsystems to their active states when there is a message to send, but not set them to their active states when the battery charge level is lower than the minimum battery charge level. In the general case, the determination of whether to power up a particular subsystem could depend on the battery charge level and whether external power is being applied, in addition to depending on the lock state and the particular touch sequence (which could be an unlock sequence, a message-without-unlock sequence, an action-without-unlock sequence, or some other predefined touch sequence).

As illustrated in FIG. 8, the user can also select from sets of preprogrammed commands, such as by using pull-down menus. Examples include sending a message, setting an alarm, making a to-do item, retrieving a URL or other network content, caching messages (such as preloading the mobile device with e-mails) and each type of action might have its own distinct pull-down menus. In the example shown, for sending a message, a recipient can be selected from a list. The user might also have the option of inputting a custom recipient not already enumerated on the list and inputting an enumerated message text or custom text. Some or all of the selections and settings for predefined actions might be remotely loaded or preloaded rather than input directly by a user.

Figure 9:
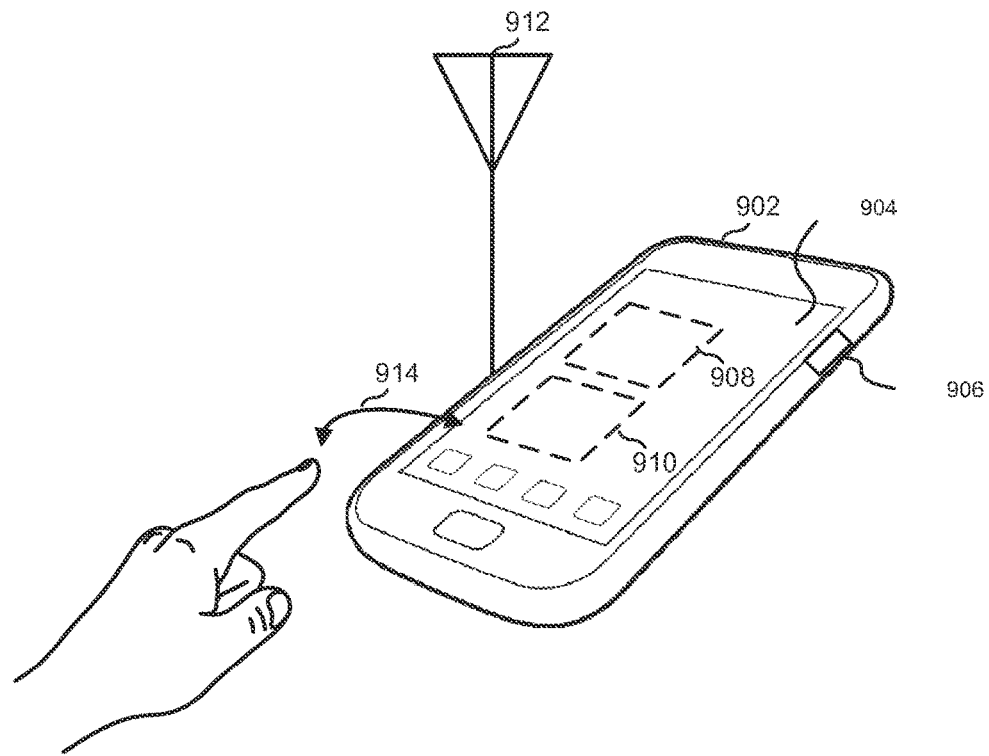
FIG. 9 is an illustration of an electronic device having a touchscreen that might be used with methods described herein.

FIG. 9 is an illustration of an electronic device 902 having a touchscreen 904 that might be used with methods described herein. As shown, electronic device 902 includes a sleep switch 906, an internal battery 908, internal circuitry 910, and an antenna 912. Sleep switch 906 might be used to send electronic device 902 into a locked, sleep state without waiting for expiration of an inactivity period. Antenna 912 might be internal to the casing of an electronic device 902. To provide touch input, a user might use his/her finger or other means of changing capacitance or other effect sensed by the touchscreen's sensors, illustrated by arrow 914.

Examples of electronic devices that provide for using the electronic device's lock interface for sending messages or performing predefined actions other than unlocking a mobile device include mobile smartphones, handheld messaging devices, tablet computers, electronic book readers, and the like.

The electronic devices may provide services such as generating content including, but not limited to, text, graphics, audio, video and/or other content usable to be provided to the user. Content transferred to a client device may be processed by the client device to provide the content in one or more forms including, but not limited to, forms that are perceptible to the user audibly, visually and/or through other senses including touch, taste, and/or smell.

Each device typically will include an operating system that provides executable program instructions for the general administration and operation of that device and typically will include a computer-readable storage medium (e.g., a hard disk, random access memory, read only memory, etc.) storing instructions that, when executed by a processor of the device, allow the device to perform its intended functions. Suitable implementations for the operating system and general functionality of the device are known or commercially available and are readily implemented by persons having ordinary skill in the art, particularly in light of the disclosure herein.

Various embodiments of the present disclosure utilize at least one network that would be familiar to those skilled in the art for supporting communications using any of a variety of commercially-available protocols, such as Transmission Control Protocol/Internet Protocol ("TCP/IP"), User Datagram Protocol ("UDP"), protocols operating in various layers of the Open System Interconnection ("OSI") model, File Transfer Protocol ("FTP"), Universal Plug and Play ("UPnP"), Network File System ("NFS"), Common Internet File System ("CIFS") and AppleTalk. The network can be, for example, a local area network, a wide-area network, a virtual private network, the Internet, an intranet, an extranet, a public switched telephone network, an infrared network, a wireless network, a satellite network and any combination thereof.

Where a system includes computerized devices, each such device can include hardware elements that may be electrically coupled via a bus, the elements including, for example, at least one central processing unit ("CPU" or "processor"), at least one input device (e.g., a mouse, keyboard, controller, touchscreen or keypad) and at least one output device (e.g., a display device, printer or speaker). Such a system may also include one or more storage devices, such as disk drives, optical storage devices and solid-state storage devices such as random access memory ("RAM") or read-only memory ("ROM"), as well as removable media devices, memory cards, flash cards, etc.

Such devices also can include a computer-readable storage media reader, a communications device (e.g., a modem, a network card (wireless or wired), an infrared communication device, etc.) and working memory as described above. The computer-readable storage media reader can be connected with, or configured to receive, a computer-readable storage medium, representing remote, local, fixed and/or removable storage devices as well as storage media for temporarily and/or more permanently containing, storing, transmitting and retrieving computer-readable information. The system and various devices also typically will include a number of software applications, modules, services or other elements located within at least one working memory device, including an operating system and application programs, such as a client application or web browser. It should be appreciated that alternate embodiments may have numerous variations from that described above. For example, customized hardware might also be used and/or particular elements might be implemented in hardware, software (including portable software, such as applets) or both. Further, connection to other computing devices such as network input/output devices may be employed.

Storage media and computer readable media for containing code, or portions of code, can include any appropriate media known or used in the art, including storage media and communication media, such as, but not limited to, volatile and non-volatile, removable and non-removable media implemented in any method or technology for storage and/or transmission of information such as computer readable instructions, data structures, program modules or other data, including RAM, ROM, Electrically Erasable Programmable Read-Only Memory ("EEPROM"), flash memory or other memory technology, Compact Disc Read-Only Memory ("CD-ROM"), digital versatile disk (DVD) or other optical storage, magnetic cassettes, magnetic tape, magnetic disk storage or other magnetic storage devices or any other medium which can be used to store the desired information and which can be accessed by the system device. Based on the disclosure and teachings provided herein, a person of ordinary skill in the art will appreciate other ways and/or methods to implement the various embodiments.

The specification and drawings are, accordingly, to be regarded in an illustrative rather than a restrictive sense. It will, however, be evident that various modifications and changes may be made thereunto without departing from the broader spirit and scope of the invention as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the invention to the specific form or forms disclosed, but on the contrary, the intention is to cover all modifications, alternative constructions and equivalents falling within the spirit and scope of the invention, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including" and "containing" are to be construed as open-ended terms (i.e., meaning "including, but not limited to,") unless otherwise noted. The term "connected," when unmodified and referring to physical connections, is to be construed as partly or wholly contained within, attached to or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. The use of the term "set" (e.g., "a set of items") or "subset" unless otherwise noted or contradicted by context, is to be construed as a nonempty collection comprising one or more members. Further, unless otherwise noted or contradicted by context, the term "subset" of a corresponding set does not necessarily denote a proper subset of the corresponding set, but the subset and the corresponding set may be equal.

Conjunctive language, such as phrases of the form "at least one of A, B, and C," or "at least one of A, B and C," unless specifically stated otherwise or otherwise clearly contradicted by context, is otherwise understood with the context as used in general to present that an item, term, etc., may be either A or B or C, or any nonempty subset of the set of A and B and C. For instance, in the illustrative example of a set having three members, the conjunctive phrases "at least one of A, B, and C" and "at least one of A, B and C" refer to any of the following sets: {A}, {B}, {C}, {A, B}, {A, C}, {B, C}, {A, B, C}. Thus, such conjunctive language is not generally intended to imply that certain embodiments require at least one of A, at least one of B and at least one of C each to be present.

Operations of processes described herein can be performed in any suitable order unless otherwise indicated herein or otherwise clearly contradicted by context. Processes described herein (or variations and/or combinations thereof) may be performed under the control of one or more computer systems configured with executable instructions and may be implemented as code (e.g., executable instructions, one or more computer programs or one or more applications) executing collectively on one or more processors, by hardware or combinations thereof. The code may be stored on a computer-readable storage medium, for example, in the form of a computer program comprising a plurality of instructions executable by one or more processors. The computer-readable storage medium may be non-transitory computer-readable storage medium.

The use of any and all examples, or exemplary language (e.g., "such as") provided herein, is intended merely to better illuminate embodiments of the invention and does not pose a limitation on the scope of the invention unless otherwise claimed. No language in the specification should be construed as indicating any non-claimed element as essential to the practice of the invention.

Embodiments of this disclosure are described herein, including the best mode known to the inventors for carrying out the invention. Variations of those embodiments may become apparent to those of ordinary skill in the art upon reading the foregoing description. The inventors expect skilled artisans to employ such variations as appropriate and the inventors intend for embodiments of the present disclosure to be practiced otherwise than as specifically described herein. Accordingly, the scope of the present disclosure includes all modifications and equivalents of the subject matter recited in the claims appended hereto as permitted by applicable law. Moreover, any combination of the above-described elements in all possible variations thereof is encompassed by the scope of the present disclosure unless otherwise indicated herein or otherwise clearly contradicted by context.

All references, including publications, patent applications and patents, cited herein are hereby incorporated by reference to the same extent as if each reference were individually and specifically indicated to be incorporated by reference and were set forth in its entirety herein.

What is claimed is:

1. A method comprising: An electronic device configured to selectively power down and selectively power up a plurality of functional subsystems of the electronic device and further configured to be unlockable by input of an unlocking sequence on a touchscreen, the electronic device comprising:

a processor subsystem;

a display subsystem;

a wireless communication subsystem that, when powered up, receives signals corresponding to incoming messages and transmits signals corresponding to outgoing messages;

a battery for supplying power at least to the processor subsystem, the display subsystem, and the wireless communication subsystem;

a first memory storage that maintains a value of a locked state of the electronic device;

a touch processing subsystem that receives inputs via the touchscreen to determine a touch input pattern, converts the touch input pattern to a touch sequence, compares the touch sequence to an unlock sequence and to a message sending sequence, outputs an unlock signal if the touch sequence matches the unlock sequence, or outputs a message initiation signal if the touch sequence matches the message sending sequence;

a power management system that selectively provides power to subsystems of the electronic device and is coupled to receive signals from the touch processing subsystem, wherein (1) when the electronic device is in an unlocked state, the power management system provides power to the processor subsystem, the display subsystem, and the wireless communication subsystem and (2) upon receiving the message initiation signal from the touch processing subsystem when the electronic device is in the locked state, the power management system provides power to the wireless communication subsystem without providing power to the display subsystem; and a message generator that, upon receiving the message initiation signal, retrieves a portion of the touch sequence, generates a message corresponding to the portion of the touch sequence, and provides the message to the wireless communication subsystem for transmission, while the electronic device is in the locked state.

2. The electronic device of claim 1, wherein the touchscreen is logically partitioned, while in the locked state, into at least a first region and a second region, wherein the touch processing subsystem represents touch inputs within the first region as Morse code dots in the touch sequence and represents touch inputs within the second region as Morse code dashes in the touch sequence, and wherein the touch processing subsystem is further configured to, upon determining that the touch sequence has been entered as Morse code dots and Morse code dashes, send the touch sequence to the message generator.

3. The electronic device of claim 1, further comprising a battery charging circuit coupled to the battery and a charging interface of the electronic device, wherein the message generator is configured to queue messages for later sending when the battery charging circuit indicates that power is not being supplied at the charging interface.

4. The electronic device of claim 1, wherein the touch processing subsystem outputs a message initiation signal only if the touch sequence does not match the unlock sequence but the touch sequence matches the message sending sequence.

5. The electronic device of claim 1, further comprising:
a second memory storage for a table of predefined actions, the predefined actions including sending messages, storing a note, and setting a reminder, each predefined action represented in the table by a corresponding touch input sequence that would be used to initiate each predefined action while the electronic device remains in the locked state.

6. A computer-implemented method for managing power consumption on an electronic device having a plurality of subsystems wherein a power state of each subsystem can be an active state or a sleep state independent of a power state of another subsystem of the plurality of subsystems, the method comprising:
sensing instances of inputs made on a lock interface of the electronic device when in a locked state, wherein the electronic device has the locked state and an unlocked state;
determining if a first input is received;
when the first input is received, altering a state of the electronic device from the locked state to the unlocked state, when the first input matches with unlock sequence, and setting the power state of each subsystem in a first set of the plurality of subsystems to the active state;
determining if a second input is received, while the electronic device is in the locked state, the second input being distinct from the first input, wherein the second input corresponds to a message initiation signal;
setting the power state of each subsystem in a second set of the plurality of subsystems to the active state, wherein at least one subsystem of the first set of the plurality of subsystems is not in the second set of the plurality of subsystems, wherein the first set of the plurality of subsystems includes a display subsystem and the second set of the plurality of subsystems set to the active state includes a wireless communication subsystem; and
performing an action represented by the second input using one or more subsystem of the second set while the electronic device is in the locked state, wherein the action comprises retrieving a portion of a touch sequence, generating a message corresponding to the portion of the touch sequence, and providing the message to the wireless communication subsystem for transmission.

7. The computer-implemented method of claim 6, wherein receiving the first input comprises receiving the instances of inputs with a sensed input sequence matching a first input sequence and wherein receiving the second input comprises receiving the instances of inputs with the sensed input sequence matching a second input sequence, the second input sequence being distinct from the first input sequence.

8. The computer-implemented method of claim 6, further comprising:
receiving a plurality of touch inputs via a touch sensor of the electronic device; and
converting the plurality of touch inputs into a digital sequence based on a location of each touch input on the touch sensor, wherein each element of the digital sequence corresponds to a region of the touch sensor, and wherein the touch sensor includes a first region assigned to a Morse code dot element and a second region assigned to a Morse code dash element, and a third region assigned to a control element other than Morse code dot and Morse code dash elements.

9. The computer-implemented method of claim 6, wherein a modem subsystem and a radio frequency ("RF") subsystem are subsystems in the second set of the plurality of subsystems, and wherein a display subsystem and a user keyboard input subsystem are subsystems in the first set of the plurality of subsystems but not in the second set of the plurality of subsystems.

10. The computer-implemented method of claim 6, further comprising:
determining whether a battery charging circuit coupled to the battery is receiving power via an external power source external to the electronic device; and
adding to a queue an indication of the action represented by the second input to queue at least a portion of the action until the battery charging circuit is receiving power via the external power source.

11. The computer-implemented method of claim 6, further comprising:
adding to a queue an indication of an additional action to be performed in response to the second input; and
performing the additional action when the electronic device is in the unlocked state.

12. The computer-implemented method of claim 6, further comprising:
determining a battery charge level;
determining a minimum battery charge level;
comparing the battery charge level to the minimum battery charge level; and
setting the power state of at least one subsystem that is in the first set and is not in the second set to the active state even when the first input is not received and the electronic device is in the locked state, if the battery charge level is greater than the minimum battery charge level.

13. The computer-implemented method of claim 6, further comprising:
determining, from a portion of the second input, an indication of a selection of a predefined action from a plurality of predefined actions including sending a message, storing a note, and setting a reminder; and
determining, from a lookup table, which indications of selection correspond to which predefined action.

14. A non-transitory computer-readable storage medium having stored thereon executable instructions that, when executed by one or more processors of a computer system, cause the computer system to at least:
sense instances of inputs made on a lock interface of an electronic device when the electronic device is in a locked state, wherein the electronic device has the locked state and an unlocked state;
determine if a first input is received;
when the first input is received, alter a state of the electronic device from the locked state to the unlocked state, when the first input matches with unlock sequence, and set a power state of each subsystem in a first set of subsystems of the electronic device to an active state;
determine if a second input is received, while the electronic device is in the locked state, the second input being distinct from the first input, wherein the second input corresponds to a message initiation signal;
set the power state of each subsystem in a second set of subsystems of the electronic device to the active state, wherein at least one subsystem of the first set of subsystems of the electronic device is not in the second set of subsystems of the electronic device, wherein the first set of subsystems includes a display subsystem and the second set of subsystems set to the active state includes a wireless communication subsystem; and perform an action represented by the second input using one or more subsystem of the second set while the electronic device is in the locked state, wherein the action comprises retrieving a portion of a touch sequence, generating a message corresponding to the portion of the touch sequence, and providing the message to the wireless communication subsystem for transmission.

15. The non-transitory computer-readable storage medium of claim 14, having stored thereon further executable instructions that cause the computer system to at least:
designate the first input as being received upon matching the instances of inputs with a first input sequence; and
designate the second input as being received upon matching the instances of inputs with a second input sequence, the second input sequence being distinct from the first input sequence.

16. The non-transitory computer-readable storage medium of claim 14, having stored thereon further executable instructions that cause the computer system to at least:
receive a plurality of touch inputs via a touch sensor of the electronic device; and
convert the plurality of touch inputs into a digital sequence based on a location of each touch input on the touch sensor, wherein each element of the digital sequence corresponds to a region of the touch sensor, and wherein the touch sensor includes a first region assigned to a Morse code dot element and a second region assigned to a Morse code dash element, and a third region assigned to a control element other than Morse code dot and Morse code dash elements.

17. The non-transitory computer-readable storage medium of claim 14, having stored thereon further executable instructions that cause the computer system to at least:
determine whether a battery charging circuit coupled to the battery is receiving power via an external power source external to the electronic device; and
add to a queue an indication of the action represented by the second input to queue at least a portion of the action until the battery charging circuit is receiving power via the external power source.

18. The non-transitory computer-readable storage medium of claim 14, having stored thereon further executable instructions that cause the computer system to at least:
add to a queue an indication of an additional action to be performed in response to the second input; and
perform the additional action when the electronic device is in the unlocked state.

19. The non-transitory computer-readable storage medium of claim 14, having stored thereon further executable instructions that cause the computer system to at least:
determine a battery charge level;
determine a minimum battery charge level;
compare the battery charge level to the minimum battery charge level; and
set a power state of at least one subsystem that is in the first set and is not in the second set to an active state even when the first input is not received and the electronic device is in the locked state, if the battery charge level is greater than the minimum battery charge level.

20. The non-transitory computer-readable storage medium of claim 14, having stored thereon further executable instructions that cause the computer system to at least:
determine, from a portion of the second input, an indication of a selection of a predefined action from a plurality of predefined actions including sending a message, storing a note, and setting a reminder; and
determine, from a lookup table, which indications of selection correspond to which predefined action.

* * * * *